(12) United States Patent
Jang et al.

(10) Patent No.: US 12,406,895 B2
(45) Date of Patent: Sep. 2, 2025

(54) SEMICONDUCTOR DEVICE

(71) Applicant: Samsung Electronics Co., Ltd., Suwon-si (KR)

(72) Inventors: Wonjung Jang, Hwaseong-si (KR); Chul-Yong Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 564 days.

(21) Appl. No.: 17/673,949

(22) Filed: Feb. 17, 2022

(65) Prior Publication Data

US 2022/0415741 A1 Dec. 29, 2022

(30) Foreign Application Priority Data

Jun. 28, 2021 (KR) .......................... 10-2021-0084193

(51) Int. Cl.
*H01L 23/31* (2006.01)
*H01L 23/00* (2006.01)
(Continued)

(52) U.S. Cl.
CPC ...... *H01L 23/3192* (2013.01); *H01L 23/3171* (2013.01); *H01L 23/481* (2013.01);
(Continued)

(58) Field of Classification Search
CPC . H01L 21/568; H01L 23/3192; H01L 23/481; H01L 21/76898; H01L 23/3128; H01L 23/3171; H01L 23/4824; H01L 23/485; H01L 23/5329; H01L 24/05; H01L 24/17; H01L 25/0652; H01L 25/18
See application file for complete search history.

(56) References Cited

U.S. PATENT DOCUMENTS 7,049,170 B2  5/2006 Savastiouk et al.
7,214,615 B2  5/2007 Miyazawa
(Continued)

FOREIGN PATENT DOCUMENTS

KR       101344978 B1    12/2013
KR     1020150115329 A    10/2015
(Continued)

OTHER PUBLICATIONS

Se-Ho Kee et al., "Copper-silicon carbide composite plating for inhibiting the extrusion of through silicon via (TSV)," Microelectronic Engineering, 214 (2019) 5-14.

*Primary Examiner* — Jay C Kim
*Assistant Examiner* — Joshua Scott Wyatt
(74) *Attorney, Agent, or Firm* — Muir Patent Law, PLLC

(57) ABSTRACT

Disclosed is a semiconductor device comprising a substrate including a first surface and a second surface that are opposite to each other, a via structure that penetrates the substrate, a first passivation pattern disposed on the first surface of the substrate and extending onto an upper sidewall of the via structure, and a second passivation pattern disposed on the first passivation pattern and exposing an uppermost surface of the first passivation pattern. At least a portion of the second passivation pattern is externally exposed. The first passivation pattern includes at least one selected from oxide and silicon oxide. The second passivation pattern includes at least one selected from nitride and silicon nitride.

20 Claims, 15 Drawing Sheets

(51) Int. Cl.
 *H01L 23/48* (2006.01)
 *H01L 25/065* (2023.01)
(52) U.S. Cl.
 CPC .......... *H01L 24/05* (2013.01); *H01L 25/0652* (2013.01); *H01L 2224/05025* (2013.01); *H01L 2225/06513* (2013.01); *H01L 2225/06541* (2013.01); *H01L 2225/06586* (2013.01)

(56) References Cited

U.S. PATENT DOCUMENTS

| | | |
|---|---|---|
| 7,358,602 B2 | 4/2008 | Hara |
| 8,399,987 B2 | 3/2013 | Kwon et al. |
| 8,803,316 B2 | 8/2014 | Lin et al. |
| 8,836,142 B2 | 9/2014 | Park et al. |
| 8,940,637 B2 | 1/2015 | Leong et al. |
| 9,076,655 B2 | 7/2015 | Na et al. |
| 9,431,332 B2 | 8/2016 | Park |
| 9,524,921 B2 | 12/2016 | Kim |
| 10,504,852 B1* | 12/2019 | Chen ................. H01L 25/0657 |
| 10,840,190 B1* | 11/2020 | Yang ................. H01L 23/5226 |
| 2020/0365612 A1* | 11/2020 | Hu ................. H01L 21/76897 |
| 2021/0111128 A1* | 4/2021 | Suk ................. H01L 23/3114 |

FOREIGN PATENT DOCUMENTS

| | | | |
|---|---|---|---|
| KR | 1020170094026 A | 8/2017 | |
| KR | 1020180121737 A | 11/2018 | |

\* cited by examiner

SEMICONDUCTOR DEVICE

CROSS-REFERENCE TO RELATED APPLICATION(S)

This U.S. nonprovisional application claims priority under 35 U.S.C § 119 to Korean Patent Application No. 10-2021-0084193 filed on Jun. 28, 2021 in the Korean Intellectual Property Office, the disclosure of which is hereby incorporated by reference in its entirety.

BACKGROUND

The present inventive concepts relate to a semiconductor device, and more particularly, to a semiconductor device including a via structure.

For high integration of semiconductor devices, it has been proposed a method of stacking a plurality of semiconductor chips. For example, it has been proposed a multi-chip package in which a plurality of semiconductor chips are mounted in a single semiconductor package or a system-in package in which stacked different chips are operated as one system. When stacking a plurality of semiconductor device, it may be needed to promptly drive the stacked semiconductor devices. A semiconductor device may be electrically connected through a conductive via to other semiconductor device or a printed circuit board. A conductive via may accomplish high transfer speeds. High integration in semiconductor device needs the development of reliable conductive vias.

SUMMARY

Some embodiments of the present inventive concepts provide a semiconductor device with increased reliability.

The object of the present inventive concepts is not limited to the mentioned above, and other objects which have not been mentioned above will be clearly understood to those skilled in the art from the following description.

According to some embodiments of the present inventive concepts, a semiconductor device may comprise: a substrate including a first surface and a second surface that are opposite to each other; a first passivation pattern in contact with the first surface of the substrate, the first passivation pattern including a recess region that is recessed toward the first surface of the substrate; a via structure that penetrates the substrate and the first passivation pattern; a second passivation pattern disposed on the recess region and spaced apart from the via structure; and a pad structure on the second passivation pattern. A bottom surface of the pad structure may be at a level higher than a level of a bottom surface of the recess region.

According to some embodiments of the present inventive concepts, a semiconductor device may comprise: a substrate including a first surface and a second surface that are opposite to each other; a via structure that penetrates the substrate; a first passivation pattern on the first surface of the substrate, the first passivation pattern extending onto an upper sidewall of the via structure; and a second passivation pattern on the first passivation pattern, the second passivation pattern exposing an uppermost surface of the first passivation pattern. At least a portion of the second passivation pattern may be externally exposed. The first passivation pattern may include at least one selected from oxide and silicon oxide. The second passivation pattern may include at least one selected from nitride and silicon nitride.

According to some embodiments of the present inventive concepts, a semiconductor device may comprise: a substrate including a first surface and a second surface that are opposite to each other; a first passivation pattern in contact with the first surface of the substrate, the first passivation pattern including a recess region that is recessed toward the first surface of the substrate; a second passivation pattern that fills the recess region; a via structure that penetrates the substrate and the first passivation pattern; a pad structure on the first surface of the substrate, a bottom surface of an end of the pad structure being in contact with a top surface of the second passivation pattern; a dielectric layer on the second surface of the substrate; a conductive pattern in the dielectric layer; and a connection terminal disposed on a bottom surface of the dielectric layer and electrically connected to the conductive pattern. The first passivation pattern may extend onto an upper sidewall of the via structure and may contact the pad structure.

DETAILED DESCRIPTION

Some embodiments of the present inventive concepts will now be described in detail with reference to the accompanying drawings to aid in clearly explaining the present inventive concepts.

Figure 1:
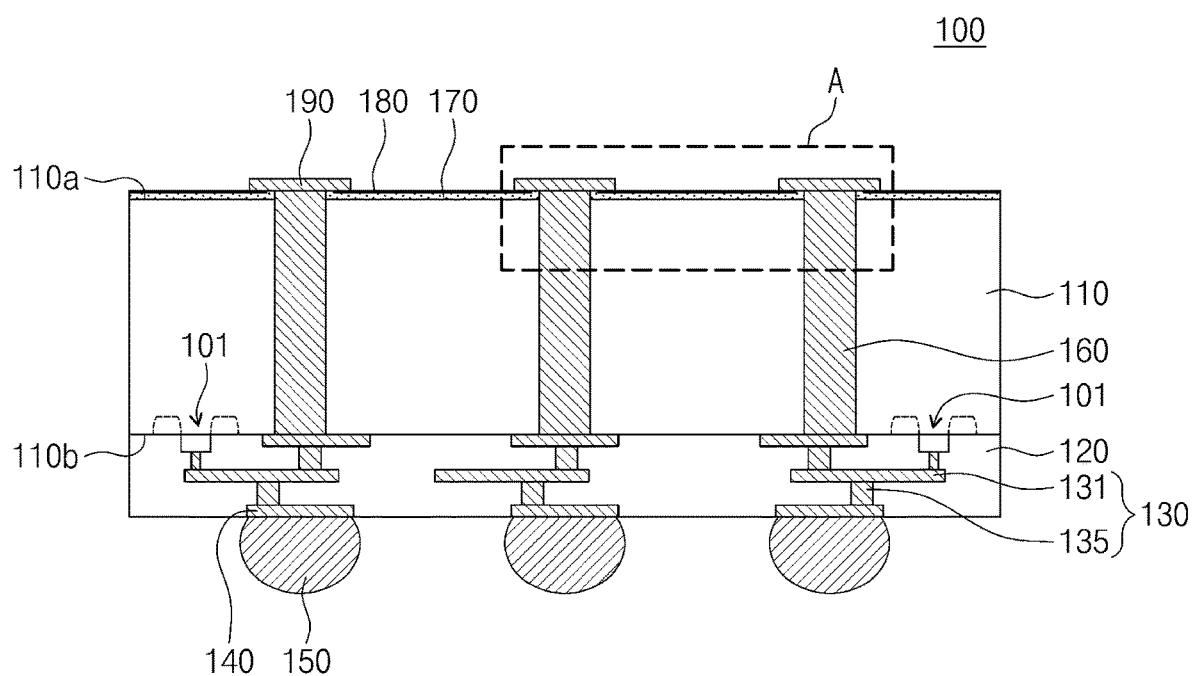
FIG. 1 illustrates a cross-sectional view showing a semiconductor device according to some embodiments of the present inventive concepts.
Figure 2:
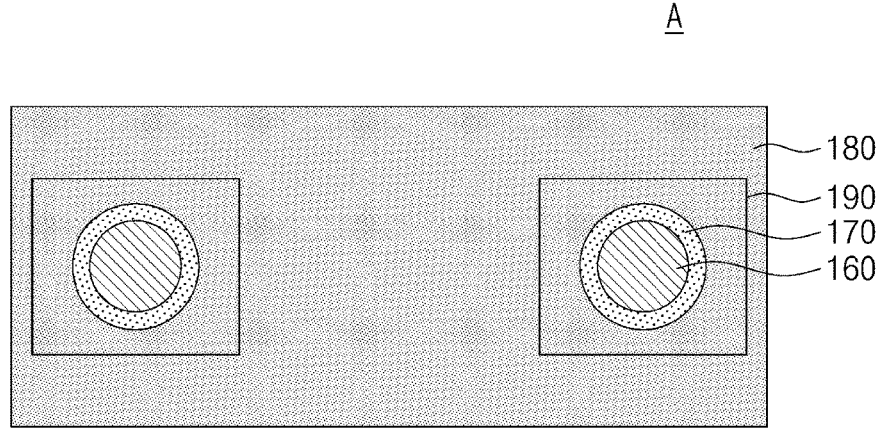
FIG. 2 illustrates an enlarged plan view showing section A of FIG. 1 according to example embodiments.
Figure 3:
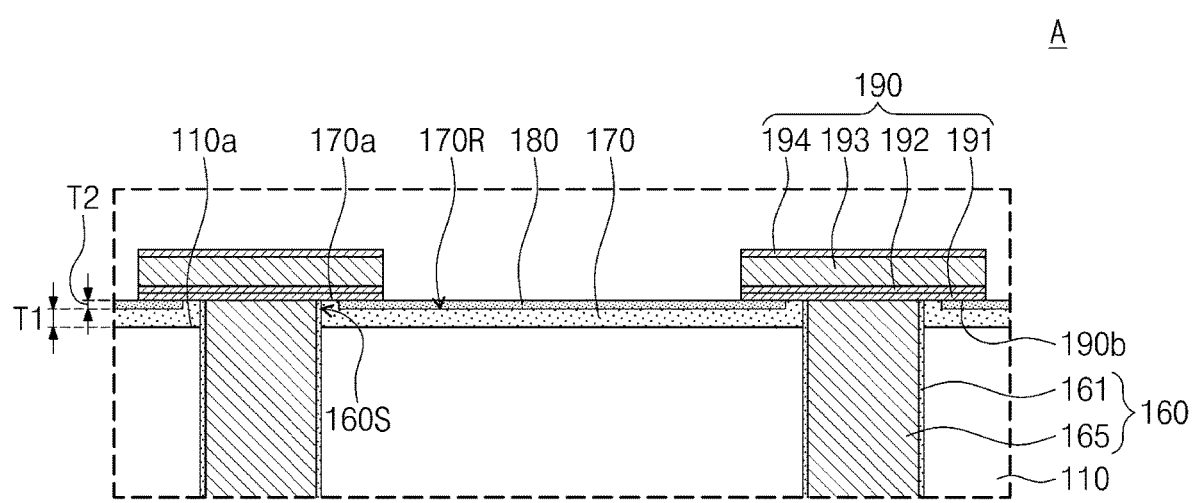
FIG. 3 illustrates an enlarged cross-sectional view showing section A of FIG. 1 according to example embodiments.

FIG. 1 illustrates a cross-sectional view showing a semiconductor device according to some embodiments of the present inventive concepts. FIG. 2 illustrates an enlarged plan view showing section A of FIG. 1. FIG. 3 illustrates an enlarged cross-sectional view showing section A of FIG. 1 according to example embodiments.

Referring to FIGS. 1 to 3, a semiconductor device 100 may include a substrate 110, a dielectric layer 120, a via structure 160, and a pad structure 190. The semiconductor device 100 may be a semiconductor chip including, for example, a memory chip, a logic chip, or a combination thereof.

The substrate 110 may have a first surface 110*a* and a second surface 110*b* that are opposite to each other. The substrate 110 may include a semiconductor material, such as silicon, germanium, or silicon-germanium. For example, the substrate 110 may be a chip-level substrate.

The dielectric layer 120 may be disposed on the second surface 110*b* of the substrate 110. The dielectric layer 120 may include a dielectric material. The dielectric layer 120 may include or be formed of, for example, at least one selected from silicon oxide, silicon nitride, and silicon oxynitride. The dielectric layer 120 may include a single layer or a plurality of stacked layers.

A wire structure 130 and a transistor 101 may be provided in the dielectric layer 120. The wire structure 130 and the transistor 101 may be disposed on the second surface 110*b* of the substrate 110. In some examples, the transistor 101 may be disposed in the substrate 110 and on the second surface 110*b* of the substrate 110. The wire structure 130 may include conductive patterns 131 and conductive vias 135. The conductive vias 135 may penetrate a portion of the dielectric layer 120 and may electrically connect to the conductive patterns 131. The conductive patterns 131 and the conductive vias 135 may include a conductive metallic material. Each of the conductive patterns 131 and the conductive vias 135 may include or be formed of, for example, at least one metal selected from copper (Cu), aluminum (Al), tungsten (W), and titanium (Ti). The transistor 101 may be provided in plural. At least one of the transistors 101 may be electrically connected to at least one of the conductive vias 135. The dielectric layer 120 may cover the wire structure 130 and the transistors 101.

In this description, the phrase "two components are electrically connected/coupled to each other" may include the meaning that "the two components are directly connected to each other or indirectly connected to each other through other conductive component(s)." It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A connection pad 140 may be provided on the second surface 110*b* of the substrate 110. The connection pad 140 may be provided in plural. The connection pads 140 may be disposed in the dielectric layer 120. The connection pads 140 may be located adjacent to a bottom surface of the dielectric layer 120. Each of the connection pads 140 may be electrically connected to a corresponding conductive via 135. The connection pads 140 may include a conductive metallic material. The connection pads 140 may include or be formed of, for example, at least one metal selected from copper (Co), nickel (Ni), aluminum (Al), tungsten (W), and titanium (Ti).

A connection terminal 150 may be provided on the bottom surface of the dielectric layer 120. The connection terminal 150 may be provided in plural. The connection terminals 150 may include a solder ball, a bump, a pillar, or a combination thereof. The connection terminals 150 may include a conductive metallic material. The connection terminals 150 may include or be formed of, for example, at least one metal selected from tin (Sn), lead (Pb), silver (Ag), zinc (Zn), nickel (Ni), gold (Au), copper (Cu), aluminum (Al), and bismuth (Bi).

A first passivation pattern 170 may be provided on the first surface 110*a* of the substrate 110. The first passivation pattern 170 may be in contact with the first surface 110*a* of the substrate 110. The first passivation pattern 170 may include a dielectric material. The first passivation pattern 170 may include or be formed of, for example, at least one selected from oxide and silicon oxide. As illustrated in FIG. 3, the first passivation pattern 170 may extend onto an upper sidewall 160S of the via structure 160. The first passivation pattern 170 may cover and contact the upper sidewall 160S of the via structure 160. The first passivation pattern 170 may have a recess region 170R that is recessed toward the first surface 110*a* of the substrate 110. For example, the first passivation pattern 170 may have a U shape when viewed in cross-section. For example, when viewed in plan, the first passivation pattern 170 may have a circular ring shape exposed on a top surface of the via structure 160. The first passivation pattern 170 may expose the top surface of the via structure 160. For example, the first passivation pattern 170 may have a minimum thickness T1 of about 1 μm to about 3 μm. In this description, the term "thickness" may indicate a vertical distance. The term such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0% to 5% deviation around 0.1 and a 0% to 5% deviation around 1, especially if such deviation maintains the same effect as the listed range.

A second passivation pattern 180 may be provided on the first surface 110*a* of the substrate 110. The second passivation pattern 180 may be disposed on the first passivation pattern 170. The second passivation pattern 180 may include a different material from that of the first passivation pattern 170. The second passivation pattern 180 may include a dielectric material. The second passivation pattern 180 may include or be formed of, for example, at least one selected from nitride and silicon nitride. The second passivation pattern 180 may expose the via structure 160 thereon. When viewed in plan as shown in FIG. 2, the second passivation pattern 180 may be spaced apart from and may not cover the via structure 160.

As illustrated in FIG. 3, the second passivation pattern 180 may lie on and fill the recess region 170R of the first passivation pattern 170. The second passivation pattern 180 may not be in contact with and may be spaced apart from the via structure 160. The second passivation pattern 180 may expose an uppermost surface 170*a* of the first passivation pattern 170. The second passivation pattern 180 may have a top surface coplanar with the uppermost surface 170*a* of the first passivation pattern 170. At least a portion of the second passivation pattern 180 may be externally exposed. The minimum thickness T1 of the first passivation pattern 170 may be greater than a thickness T2 of the second passivation pattern 180. For example, the thickness T2 of the second passivation pattern 180 may range from about 0.1 μm to about 0.6 μm.

The via structure 160 may be provided in the substrate 110 and the first passivation pattern 170. The via structure 160 may penetrate the substrate 110 and the first passivation pattern 170. The via structure 160 may be electrically connected to the wire structure 130. The via structure 160 may be provided in plural. The via structures 160 and the connection terminals 150 may transfer electrical signals from or to the semiconductor device 100.

As illustrated in FIG. 3, the first passivation pattern 170 may surround the upper sidewall 160S of the via structure 160. The via structure 160 may be exposed on the first passivation pattern 170 and the second passivation pattern 180. The via structure 160 may expose the uppermost surface 170a of the first passivation pattern 170. The top surface of the via structure 160 may be coplanar with the uppermost surface 170a of the first passivation pattern 170. The top surface of the via structure 160 may be located at the same level as that of the top surface of the second passivation pattern 180. In this description, the term "level" may indicate a height from a top surface of the dielectric layer 120.

The via structure 160 may include a through via 165 and a via dielectric layer 161. The via dielectric layer 161 may be interposed between the substrate 110 and the through via 165 and between the first passivation pattern 170 and the through via 165. The via dielectric layer 161 may surround a sidewall of the through via 165. The second passivation pattern 180 may not be in contact with and may be spaced apart from the via dielectric layer 161. The via dielectric layer 161 may include a dielectric material. The via dielectric layer 161 may include or be formed of, for example, at least one selected from oxide, nitride, silicon oxide, silicon nitride, and silicon oxynitride. The through vias 165 may include a conductive metallic material. The through via 165 may include or be formed of, for example, at least one selected from copper (Cu), aluminum (Al), tungsten (W), and titanium (Ti). According to some embodiments, a barrier pattern may further be interposed between the through via 165 and the via dielectric layer 161. The barrier pattern may include or be formed of a conductive metallic material or conductive metal nitride, for example, at least one selected from titanium (Ti), titanium nitride (TiN), tantalum (Ta), tantalum nitride (TaN), tungsten (W), and tungsten nitride (WN).

A pad structure 190 may be provided on the first surface 110a of the substrate 110. The pad structure 190 may be disposed on the via structure 160, the first passivation pattern 170, and the second passivation pattern 180. The pad structure 190 may be provided in plural. Each of the pad structures 190 may be disposed on and electrically connected to a corresponding via structure 160. The pad structure 190 may cover and contact the uppermost surface 170a of the first passivation pattern 170. The pad structure 190 may cover and contact a portion of the top surface of the second passivation pattern 180. The pad structure 190 may be exposed on a top surface of the semiconductor device 100. The pad structure 190 may have a bottom surface that is substantially flat. The pad structure 190 may have a rectangular shape when viewed in plan, but no limitation may be imposed on the planar shape of the pad structure 190. The pad structure 190 may include a conductive metallic material. The pad structure 190 may include or be formed of, for example, at least one metal selected from copper (Cu), nickel (Ni), titanium (Ti), gold (Au), aluminum (Al), and tungsten (W).

As illustrated in FIG. 3, the bottom surface of the pad structure 190 may be located at a higher level than that of a bottom surface of the recess region 170R included in the first passivation pattern 170. The pad structure 190 may have an end whose bottom surface 190b is in contact with the top surface of the second passivation pattern 180. The pad structure 190 may be in contact with the first passivation pattern 170 that extends onto the upper sidewall 160S of the via structure 160. The pad structure 190 may include a first pad pattern 191, a second pad pattern 192, a third pad pattern 193, and a fourth pad pattern 194 that are sequentially stacked. The first pad pattern 191 may be disposed on the via structure 160, the uppermost surface 170a of the first passivation pattern 170, and the portion of the top surface of the second passivation pattern 180. The second pad pattern 192 may be disposed on the first pad pattern 191. The third pad pattern 193 may be disposed on the second pad pattern 192. The fourth pad pattern 194 may be formed on the third pad pattern 193. The first pad pattern 191 may include or be formed of, for example, titanium (Ti) or copper (Cu). The second pad pattern 192 may include, for example, copper (Cu). The third pad pattern 193 may include or be formed of, for example, nickel (Ni) or copper (Cu). The fourth pad pattern 194 may include or be formed of, for example, gold (Au) or copper (Cu).

According to the present inventive concepts, the first passivation pattern 170 and the second passivation pattern 180 may be disposed on the first surface 110a of the substrate 110, and the first passivation pattern 170 may cover the upper sidewall 160S of the via structure 160. Therefore, even when the via structure 160 undergoes a polishing process as a subsequent process, the via structure 160 may be prevented from being curved or bent, and thus the top surface of the via structure 160 may be flat. As a result, an increased contact area may be provided between the via structure 160 and the pad structure 190, and the semiconductor device 100 may increase in reliability.

FIGS. 4, 5, 6, 8, 10, 12, and 14 illustrate cross-sectional views showing a method of fabricating a semiconductor device according to some embodiments of the present inventive concepts. FIG. 7 illustrates an enlarged cross-sectional view showing section A of FIG. 6 according to example embodiments. FIG. 9 illustrates an enlarged cross-sectional view showing section A of FIG. 8 according to example embodiments. FIG. 11 illustrates an enlarged cross-sectional view showing section A of FIG. 10 according to example embodiments. FIG. 13 illustrates an enlarged cross-sectional view showing section A of FIG. 12 according to example embodiments. FIG. 3 corresponds to an enlarged cross-sectional view showing section A of FIG. 14. A duplicate description will be omitted below.

Figure 4:
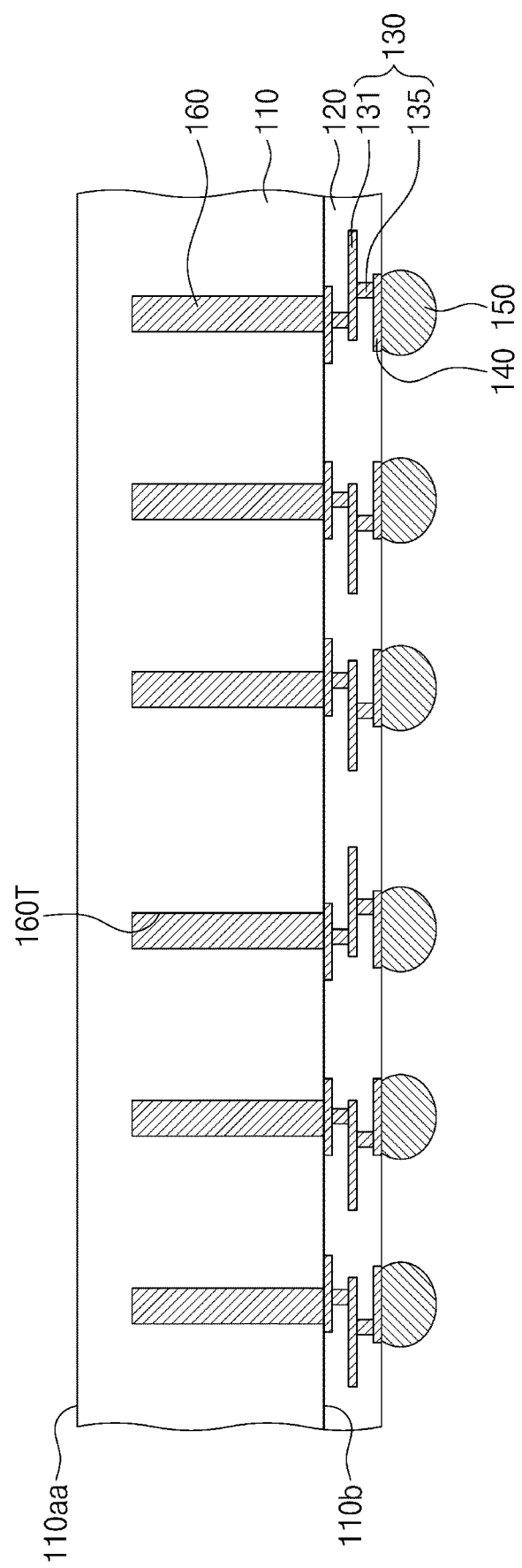
FIGS. 4, 5, 6, 8, 10, 12, and 14 illustrate cross-sectional views showing a method of fabricating a semiconductor device according to some embodiments of the present inventive concepts.

Referring to FIG. 4, a substrate 110 may be provided. For example, the substrate 110 may be a wafer-level substrate. The substrate 110 may have a top surface 110aa and a second surface 110b that are opposite to each other.

A via structure 160 may be formed in the substrate 110. The via structure 160 may penetrate a portion of the substrate 110. The via structure 160 may not penetrate the top surface 110aa of the substrate 110. The via structure 160 may not be exposed on the top surface 110aa of the substrate 110. As shown in FIG. 3, the via structure 160 may include the through via 165 and the via dielectric layer 161. The formation of the via structure 160 may include forming a via hole 160T on the second surface 110b of the substrate 110, forming the via dielectric layer 161 on the via hole 160T, and forming the through via 165 on the via dielectric layer 161. The formation of the via hole 160T may include etching the substrate 110 such that the substrate 110 may be recessed from the second surface 110b toward the top surface 110aa of the substrate 110. The via dielectric layer 161 may conformally cover an inner sidewall of the via hole 160T. The through via 165 may fill a remaining portion of the via hole 160T.

A dielectric layer 120, a wire structure 130, and connection pads 140 may be formed on the second surface 110b of the substrate 110. Connection terminals 150 may be formed on the second surface 110b of the substrate 110. The connection terminals 150 may be formed on corresponding connection pads 140.

Figure 5:
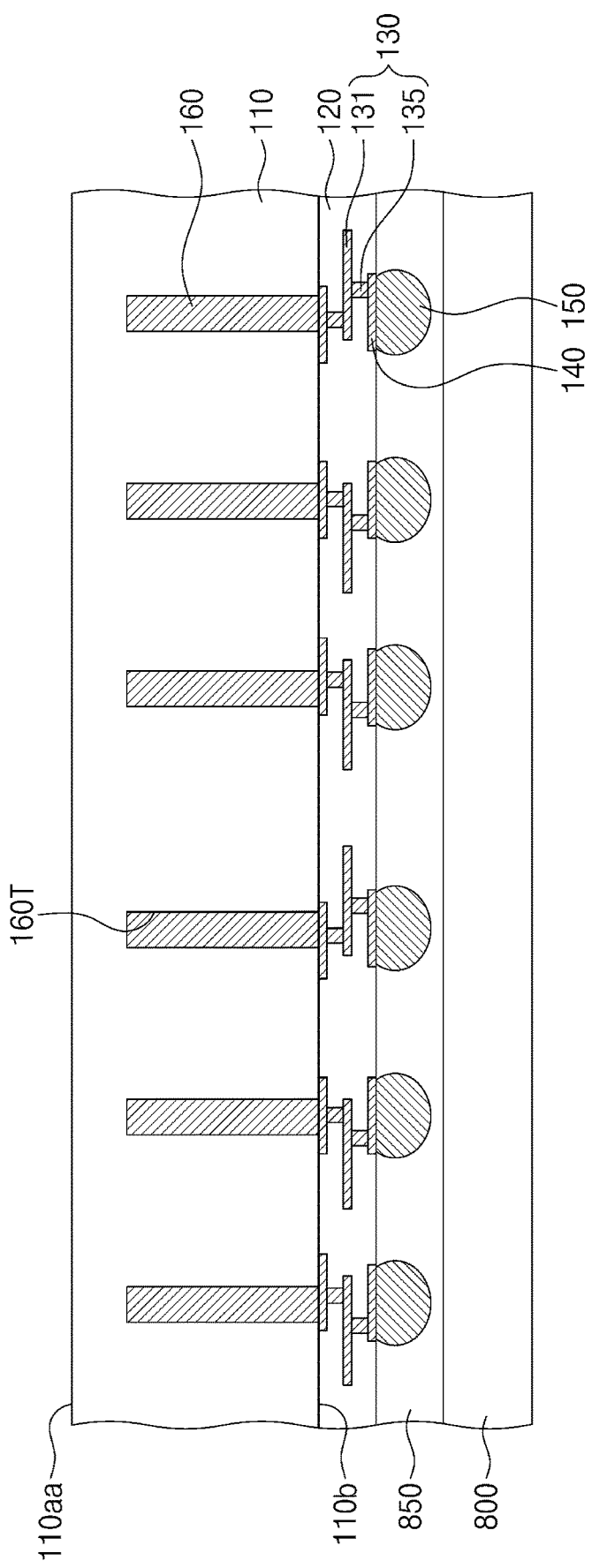

Referring to FIG. 5, a carrier substrate 800 and an adhesion layer 850 may be formed on a bottom surface of the dielectric layer 120. The adhesion layer 850 may be interposed between the carrier substrate 800 and the dielectric layer 120, and may attach the substrate 110 and the dielectric layer 120 to the carrier substrate 800. The adhesion layer 850 may cover the connection terminals 150 and the bottom surface of the dielectric layer 120. The adhesion layer 850 may include an adhesive material. The adhesion layer 850 may include or be formed of, for example, a polymer.

Figure 6:
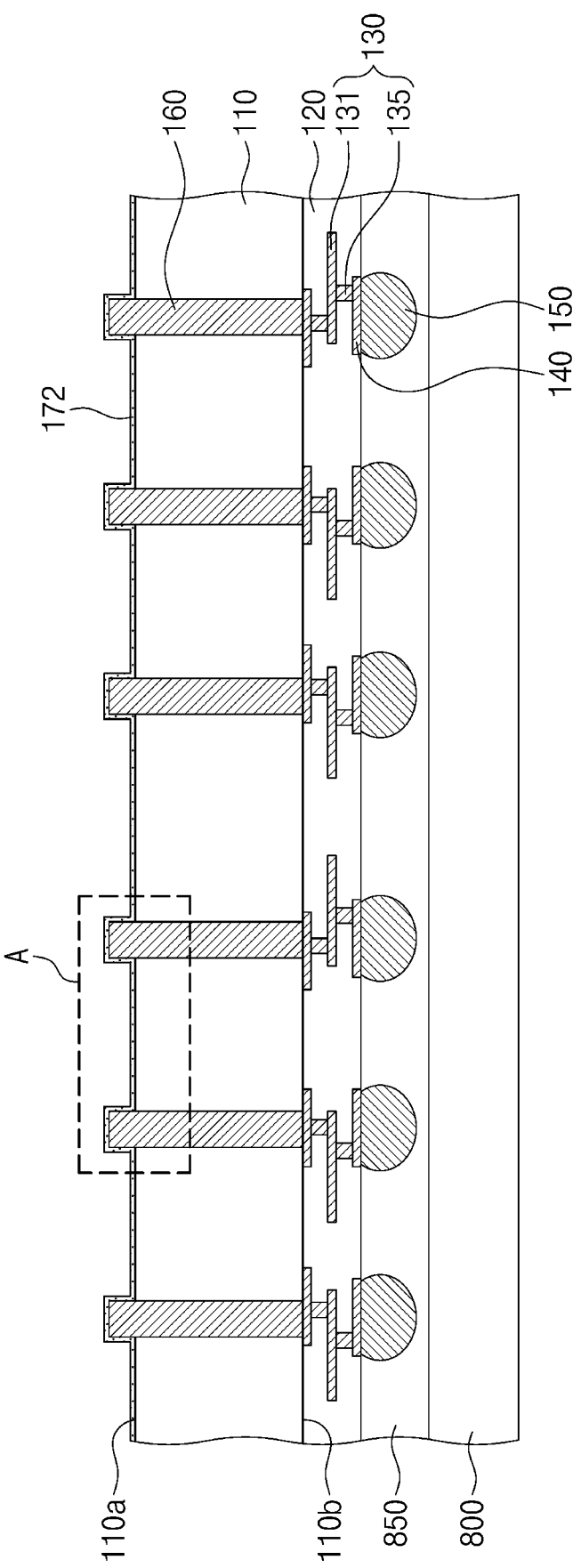
Figure 7:
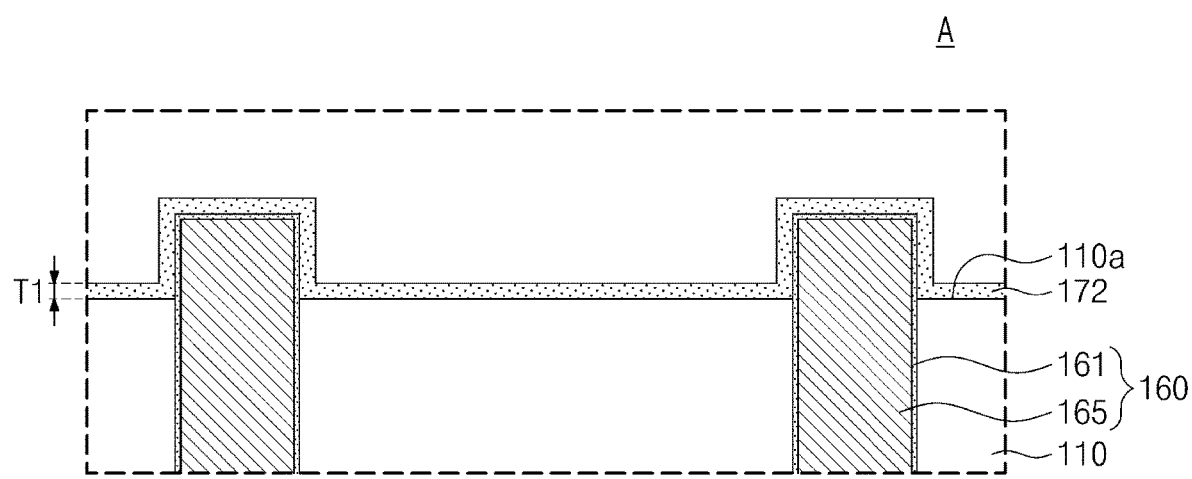
FIG. 7 illustrates an enlarged cross-sectional view showing section A of FIG. 6 according to example embodiments.

Referring to FIGS. 6 and 7, a thinning process may be performed on the top surface 110*aa* of the substrate 110. The thinning process may remove a portion of the substrate 110, and the substrate 110 may be allowed to be thinned. For example, the substrate 110 may have a first surface 110*a* and the second surface 110*b* that are opposite to each other. The thinning process may cause that an upper portion of the via structure 160 may be exposed on the first surface 110*a* of the substrate 110. After the thinning process is performed, the first surface 110*a* of the substrate 110 may be located at a higher level than that of a top surface of the via structure 160. The thinning process may include, for example, an etching process or a grinding process.

The first passivation layer 172 may be formed on the first surface 110*a* of the substrate 110. The first passivation layer 172 may conformally cover the first surface 110*a* of the substrate 110, an exposed upper sidewall of the via structure 160, and the top surface of the via structure 160. The formation of the first passivation layer 172 may be performed by, for example, chemical vapor deposition (CVD), atomic layer deposition (ALD), or physical vapor deposition (PVD). The formation of the first passivation layer 172 may be a wafer-level process. For example, the first passivation layer 172 may have a thickness T1 of about 1 µm to about 3 µm.

Figure 8:
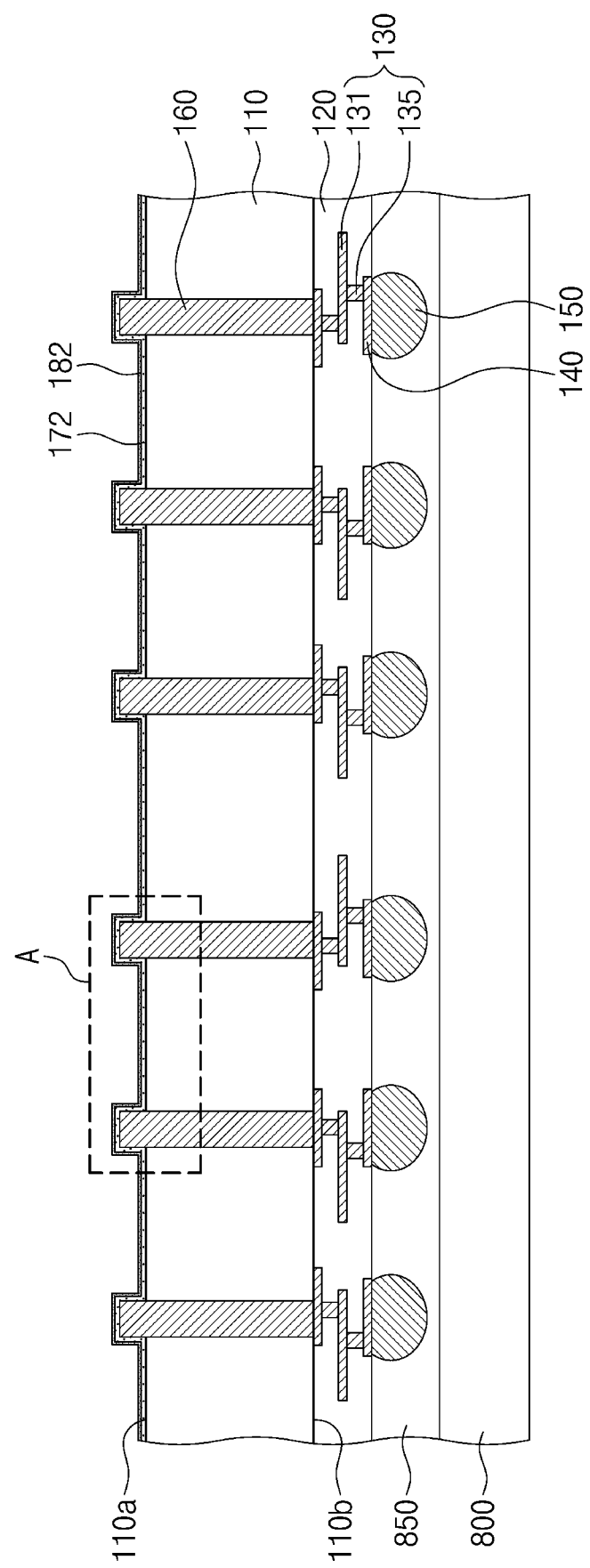
Figure 9:
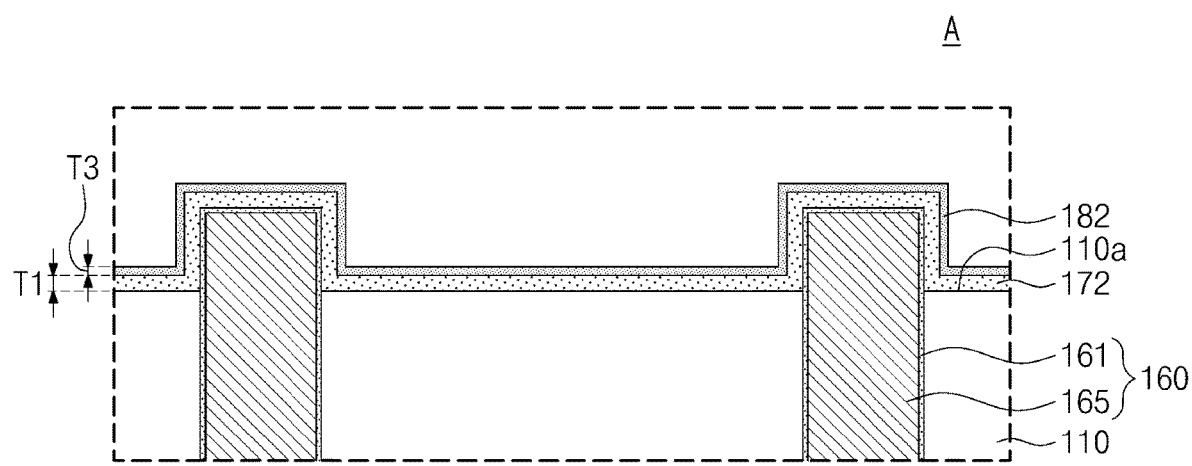
FIG. 9 illustrates an enlarged cross-sectional view showing section A of FIG. 8 according to example embodiments.

Referring to FIGS. 8 and 9, a second passivation layer 182 may be formed on the first surface 110*a* of the substrate 110. The second passivation layer 182 may conformally cover a top surface of the first passivation layer 172. The formation of the second passivation layer 182 may be performed by, for example, chemical vapor deposition (CVD), atomic layer deposition (ALD), or physical vapor deposition (PVD). The formation of the second passivation layer 182 may be a wafer-level process. For example, the second passivation layer 182 may have a thickness T3 of about 0.3 µm to about 0.8 µm.

Figure 10:
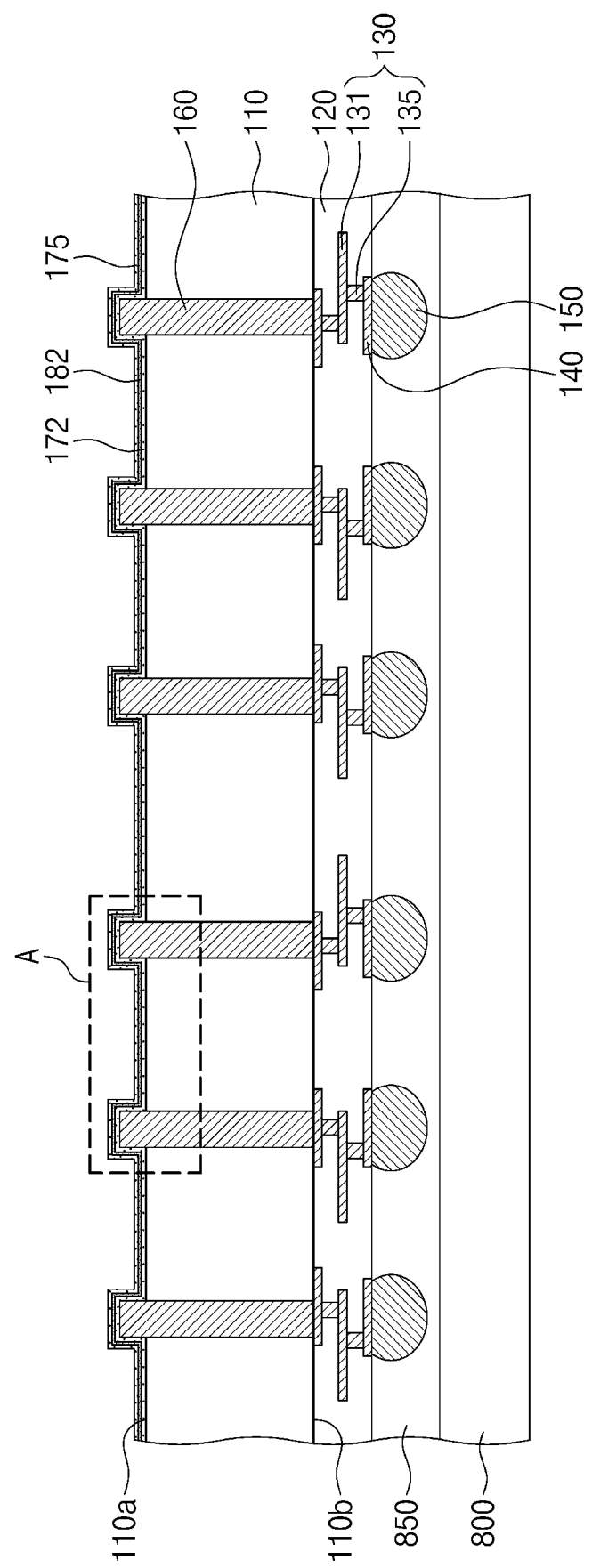
Figure 11:
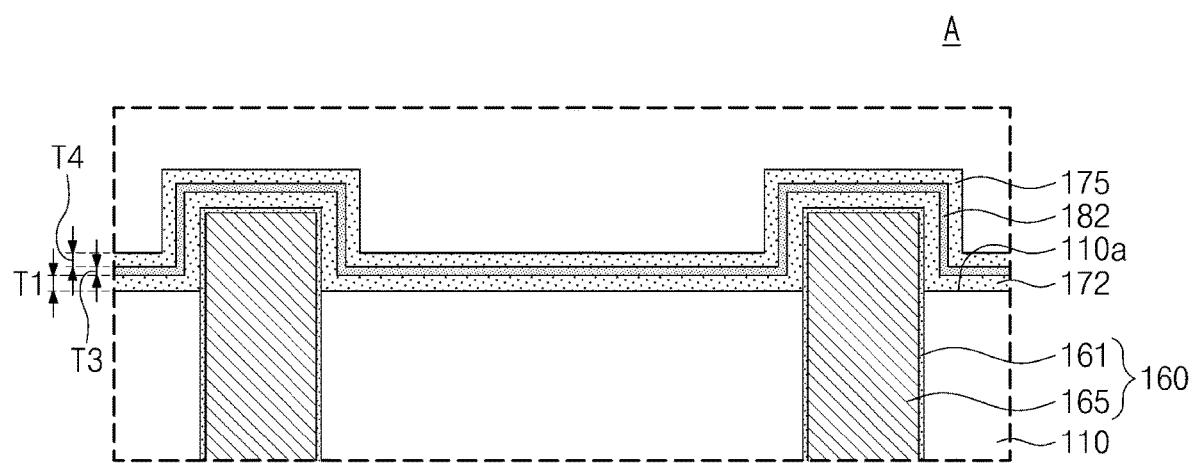
FIG. 11 illustrates an enlarged cross-sectional view showing section A of FIG. 10 according to example embodiments.

Referring to FIGS. 10 and 11, a third passivation layer 175 may be formed on the first surface 110*a* of the substrate 110. The third passivation layer 175 may conformally cover a top surface of the second passivation layer 172. The formation of the third passivation layer 175 may be performed by, for example, chemical vapor deposition (CVD), atomic layer deposition (ALD), or physical vapor deposition (PVD). The formation of the third passivation layer 175 may be a wafer-level process. For example, the third passivation layer 175 may have a thickness T4 of about 0.1 µm to about 1.5 µm. The first and third passivation layers 172 and 175 may be formed thicker than the second passivation layer 182. In some examples, the thickness T4 of the third passivation layer 175 may be formed thinner than the thickness T3 of the second passivation layer 182. Therefore, even when a polishing process is performed as a subsequent process, the via structure 160 may be prevented from being curved or bent.

Figure 12:
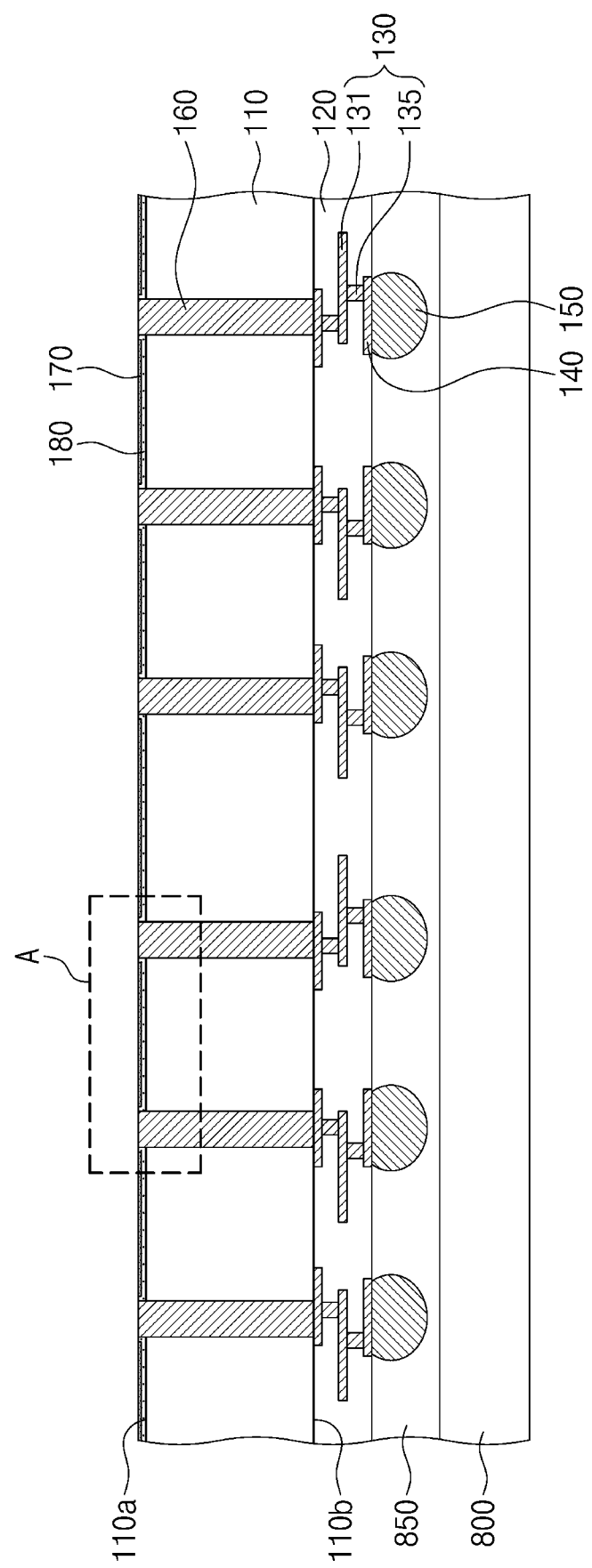
Figure 13:
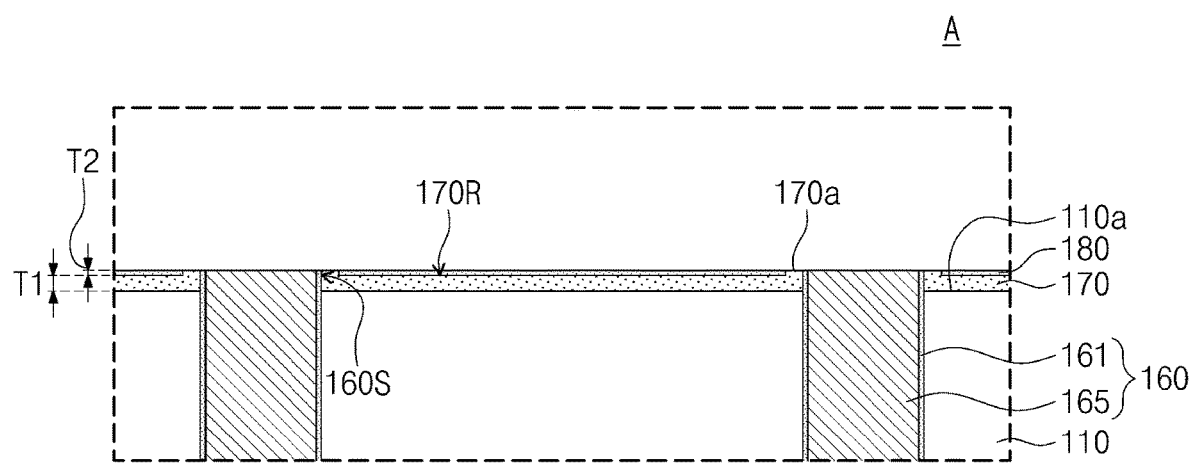
FIG. 13 illustrates an enlarged cross-sectional view showing section A of FIG. 12 according to example embodiments.

Referring to FIGS. 12 and 13, a polishing process may be performed on the first surface 110*a* of the substrate 110. The polishing process may remove an upper portion of the via structure 160 exposed on the first surface 110*a* of the substrate 110. The polishing process may remove the third passivation layer 175. The polishing process may remove a portion of the second passivation layer 182 to form a second passivation pattern 180. The polishing process may remove a portion of the first passivation layer 172 to form a first passivation pattern 170. The first passivation pattern 170 may extend onto an upper sidewall 160S of the via structure 160. The first passivation pattern 170 may cover the upper sidewall 160S of the via structure 160. The first passivation pattern 170 may have a recess region 170R that is recessed toward the first surface 110*a* of the substrate 110. The first passivation pattern 170 may have a minimum thickness T1 the same as that discussed with reference to FIG. 7 before the polishing process is performed. For example, the minimum thickness T1 of the first passivation pattern 170 may range from about 1 µm to about 3 µm. The second passivation pattern 180 may fill the recess region 170R. For example, the thickness T2 of the second passivation pattern 180 may range from about 0.1 µm to about 0.6 µm. After the polishing process is performed, the top surface of the via structure 160 may be located at the same level as that of a top surface of the second passivation pattern 180. The top surface of the via structure 160 may be located at the same level as that of an uppermost surface 170*a* of the first passivation pattern 170. The top surface of the via structure 160 may be located at a higher level than that of the first surface 110*a* of the substrate 110. The polishing process may include, for example, a chemical mechanical polishing (CMP) process.

Figure 14:
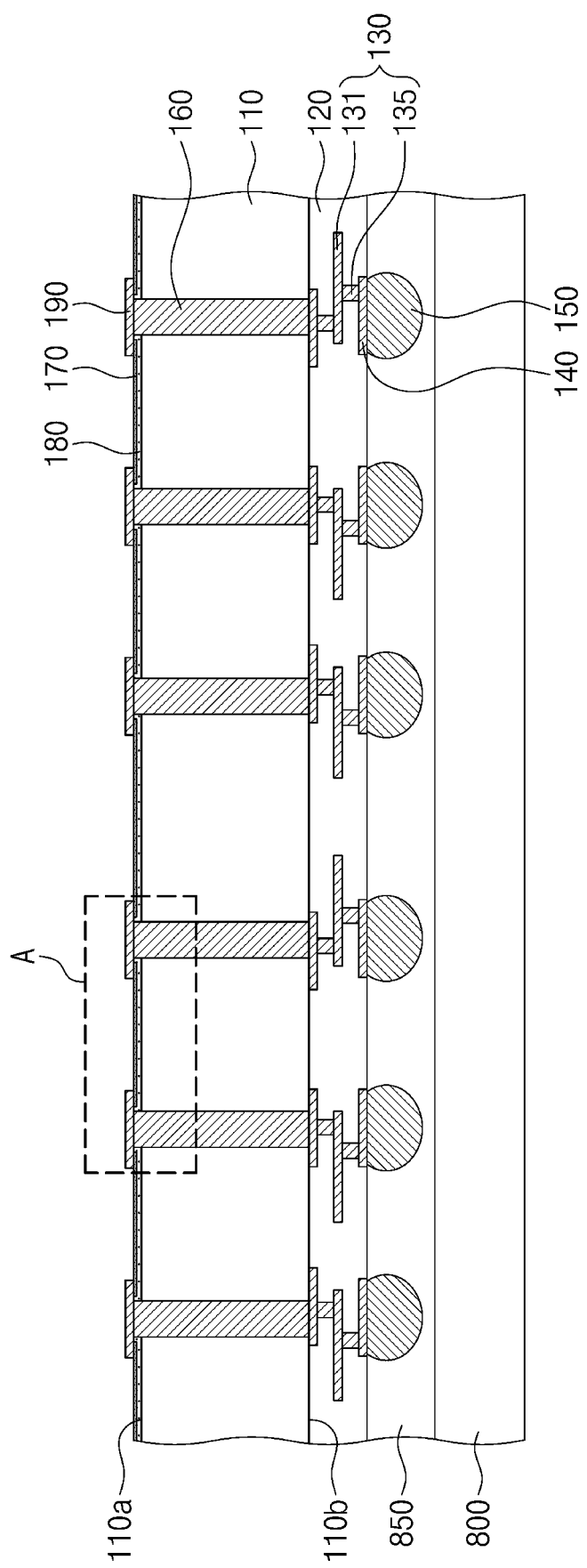

Referring to FIG. 14, a pad structure 190 may be formed on the first surface 110*a* of the substrate 110. The pad structure 190 may be formed on the via structure 160, the first passivation pattern 170, and the second passivation pattern 180. Referring back to FIG. 3, the pad structure 190 may cover the uppermost surface 170*a* of the first passivation pattern 170, and may also cover a portion of the top surface of the second passivation pattern 180.

According to the present inventive concepts, after the first, second, and third passivation layers 172, 182, and 175 are formed on the via structure 160, a polishing process may be performed on the first surface 110*a* of the substrate 110. For example, as the first and third passivation layers 172 and 175 are formed relatively thick, even when the polishing process is performed on the via structure 160, the via structure 160 may be prevented from being curved or bent. As a result, the via structure 160 may be effectively connected to the pad structure 190 that is formed in a subsequent process, a semiconductor device may increase in reliability.

In example embodiments, the carrier substrate 800 and the adhesion layer 850 formed on the bottom surface of the dielectric layer 120 may be removed after the pad structure 190 is formed.

The substrate 110 may undergo a sawing process to separate semiconductor devices from each other, and a semiconductor device 100 may be formed as discussed with reference to FIGS. 1 to 3.

Figure 15:
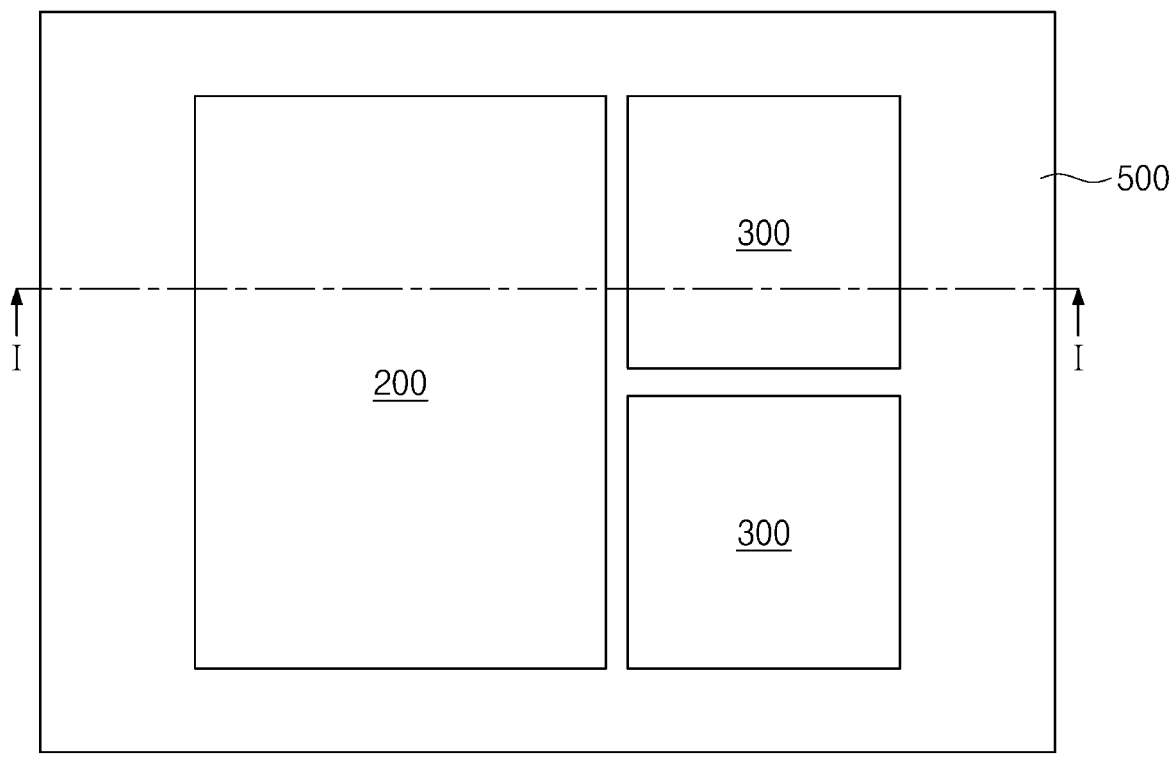
FIG. 15 illustrates a plan view showing a semiconductor package including a semiconductor device according to some embodiments of the present inventive concepts.
Figure 16:
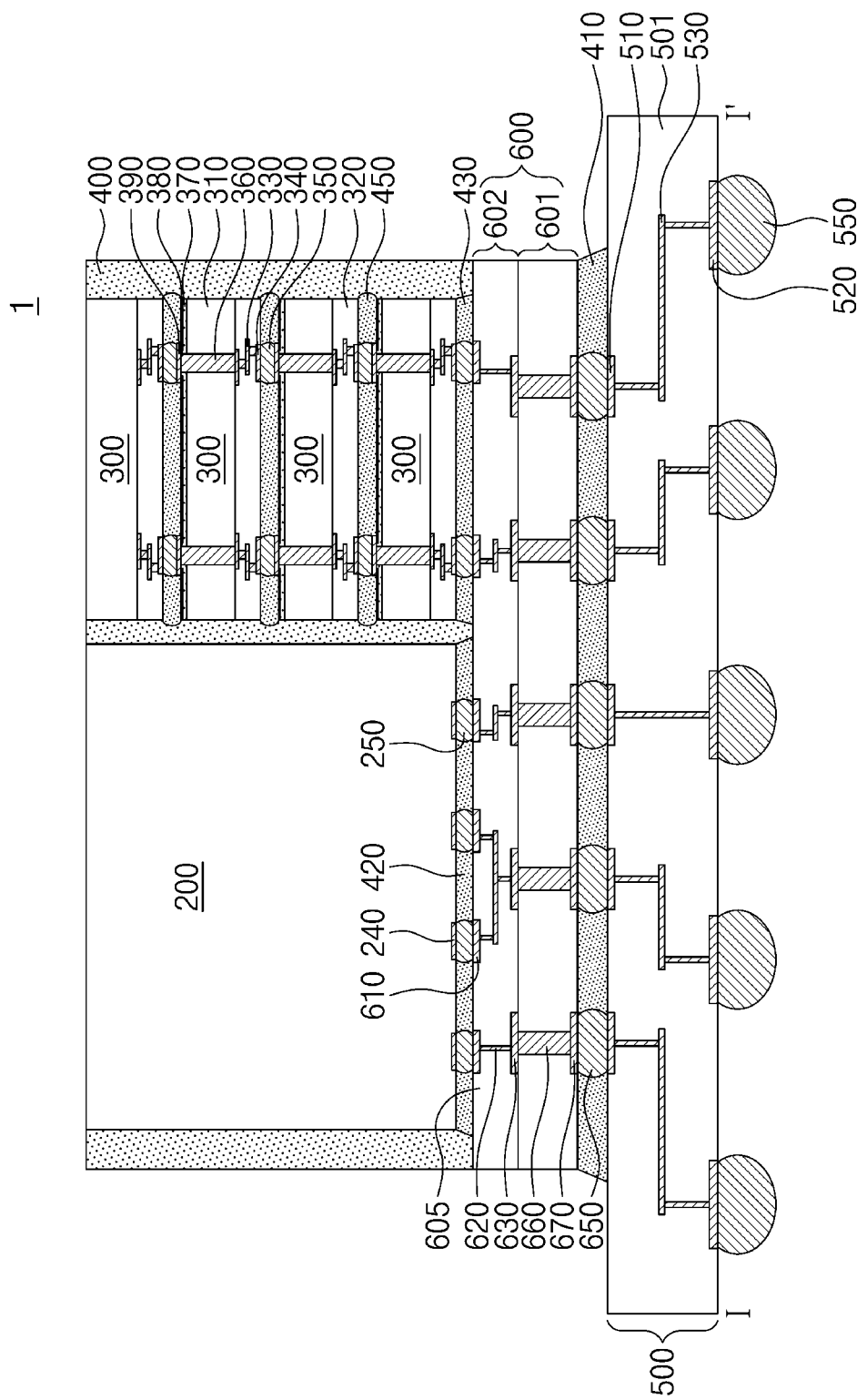
FIG. 16 illustrates a cross-sectional view taken along line I-I' of FIG. 15 according to example embodiments.

FIG. 15 illustrates a plan view showing a semiconductor package including a semiconductor device according to some embodiments of the present inventive concepts. FIG. 16 illustrates a cross-sectional view taken along line I-I' of FIG. 15 according to example embodiments.

Referring to FIGS. 15 and 16, a semiconductor package 1 may include a package substrate 500, an interposer substrate 600, a first semiconductor chip 200, and a second semiconductor chip 300.

The package substrate 500 may include a dielectric base layer 501, package substrate pads 510, terminal pads 520, and package substrate lines 530. For example, the package substrate 500 may be a printed circuit board (PCB). The dielectric base layer 501 may include a single layer or a plurality of stacked layers. The dielectric base layer 501 may correspond to the dielectric layer 120 in FIGS. 1 and 14. The package substrate pads 510 may be adjacent to a top surface of the package substrate 500, and the terminal pads 520 may be adjacent to a bottom surface of the package substrate 500. The package substrate pads 510 may be exposed on the top surface of the package substrate 500. The package substrate lines 530 may be disposed in the dielectric base layer 501 and may be electrically connected to the package substrate pads 510 and the terminal pads 520. Each of the package substrate pads 510, the terminal pads 520, and the package substrate lines 530 may include or be formed of a conductive metallic material, for example, at least one metal selected from copper (Cu), aluminum (Al), tungsten (W), and titanium (Ti).

The package substrate 500 may be provided with external terminals 550 on the bottom surface thereof. The external terminals 550 may be disposed on bottom surfaces of the terminal pads 520. The external terminals 550 may be electrically connected to the package substrate lines 530. The external terminals 550 may be coupled to an external device. Therefore, external electrical signals may be transmitted through the external terminals 550 to and from the package substrate pads 510. The external terminals 550 may include solder balls or solder bumps. The external terminals 550 may include or be formed of a conductive metallic material, for example, at least one metal selected from tin (Sn), lead (Pb), silver (Ag), zinc (Zn), nickel (Ni), gold (Au), copper (Cu), aluminum (Al), and bismuth (Bi).

The interposer substrate 600 may be disposed on the package substrate 500. The interposer substrate 600 may include a substrate layer 601 and a wiring layer 602 on the substrate layer 601.

The substrate layer 601 may include a plurality of through electrodes 660 and a plurality of lower pads 670. For example, the substrate layer 601 may be a silicon (Si) substrate. The substrate layer 601 may correspond to the substrate 110 in FIGS. 1 and 14. The through electrodes 660 may be disposed in the substrate layer 601 and may penetrate the substrate layer 601. Each of the through electrodes 660 may be electrically connected to a corresponding one of upper substrate lines 630 which will be discussed below. The through electrodes 660 and the upper substrate lines 630 may respectively correspond to the via structure 160 and the pad structure 190 in FIGS. 1 and 14. The lower pads 670 may be disposed adjacent to a bottom surface of the substrate layer 601. The lower pads 670 may be electrically connected to the through electrodes 660. The lower pads 670 may correspond to the pad structure 190 in FIGS. 1 and 14. The through electrodes 660 and the lower pads 670 may include or be formed of a conductive metallic material, for example, at least one metal selected from copper (Cu), aluminum (Al), tungsten (W), and titanium (Ti).

The wiring layer 602 may include upper pads 610, internal lines 620, upper substrate lines 630, and a wiring dielectric layer 605. The wiring dielectric layer 605 may cover the upper pads 610, the internal lines 620, and the upper substrate lines 630. The upper pads 610 may be adjacent to a top surface of the wiring layer 602, and the upper substrate lines 630 may be adjacent to a bottom surface of the wiring layer 602. The upper pads 610 may be exposed on the top surface of the wiring layer 602. The internal lines 620 may be disposed in the wiring dielectric layer 605 and may be electrically connected to the upper pads 610 and the upper substrate lines 630. The upper pads 610, the internal lines 620, and the upper substrate lines 630 may include or be formed of a conductive metallic material, for example, at least one metal selected from copper (Cu), aluminum (Al), tungsten (W), and titanium (Ti).

The package substrate 500 and the interposer substrate 600 may have substrate bumps 650 interposed therebetween. The substrate bumps 650 may electrically connect the package substrate 500 to the interposer substrate 600. Each of the lower pads 670 may be electrically connected through a corresponding substrate bump 650 to a corresponding package substrate pad 510. The substrate bumps 650 may include a conductive material and may have at least one selected from a solder ball shape, a bump shape, and a pillar shape. A pitch of the substrate bumps 650 may be less than that of the external terminals 550.

A substrate under-fill layer 410 may be interposed between the package substrate 500 and the interposer substrate 600. The substrate under-fill layer 410 may fill a space between the substrate bumps 650 and may encapsulate the substrate bumps 650. For example, the substrate under-fill layer 410 may include a non-conductive film (NCF), such as an Ajinomoto build-up film (ABF).

The first semiconductor chip 200 may be mounted on the interposer substrate 600. The first semiconductor chip 200 may include a logic chip, a buffer chip, or a system-on-chip (SOC). In example embodiments, the first semiconductor chip 200 may be at least one of the logic chip, the buffer chip, and the system-on-chip (SOC). For example, the first semiconductor chip 200 may be an application specific integrated circuit (ASIC) chip or an application processor (AP) chip. The ASIC chip may include an application specific integrated circuit (ASIC). The first semiconductor chip 200 may include a central processing unit (CPU) or a graphic processing unit (GPU).

A plurality of second semiconductor chips 300 may be mounted on the interposer substrate 600. The second semiconductor chips 300 may be disposed horizontally spaced apart from the first semiconductor chip 200. The second semiconductor chips 300 may be vertically stacked on the interposer substrate 600, and thus a chip stack may be formed. In some embodiments, the chip stack may be provided in plural. The second semiconductor chips 300 may be of a different type from the first semiconductor chip 200. The second semiconductor chips 300 may be memory chips. The memory chips may include high bandwidth memory (HBM) chips. For example, the second semiconductor chips 300 may include dynamic random memory (DRAM) chips. Differently from that shown, the number of the chip stacks, of the first semiconductor chip 200, and of the second semiconductor chips 300 may be variously changed.

Each of the second semiconductor chips 300 may include a chip substrate 310, a chip dielectric layer 320, integrated circuits (not shown), chip vias 360, a lower passivation pattern 370, an upper passivation pattern 380, and chip pad structures 390. The chip dielectric layer 320 may be disposed on a bottom surface of the chip substrate 310. For example, the integrated circuits may be provided in the chip dielectric layer 320. In some examples, the integrated circuits may be provided in the chip substrate 310. The chip dielectric layer 320 may have chip lines 330 disposed therein. A description of the chip substrate 310, the chip dielectric layer 320, and the chip lines 330 may be the same as that of the substrate 110, the dielectric layer 120, and the wire structure 130 discussed with reference to FIGS. 1 to 3.

The lower passivation pattern 370 may be disposed on a top surface of the chip substrate 310. The upper passivation pattern 380 may be disposed on the lower passivation pattern 370. The chip vias 360 may penetrate the chip substrate 310 and the lower passivation pattern 370, and may electrically connect to the chip lines 330. The chip pad structures 390 may be disposed on the chip vias 360. A description of the chip vias 360, the lower passivation pattern 370, the upper passivation pattern 380, and the chip pad structure 390 may be the same as that of the via structure 160, the first passivation pattern 170, the second passivation pattern 180, and the pad structure 190 discussed with reference to FIGS. 1 to 3. In contrast, in some embodiments, an uppermost one of the second semiconductor chips 300 may not include the chip vias 360.

The first semiconductor chip 200 may include first chip pads 240 adjacent to a bottom surface thereof. The second semiconductor chips 300 may include second chip pads 340 adjacent to top and bottom surfaces thereof. However, the second chip pads 340 may not be provided on the top surface of the uppermost second semiconductor chip 300. Each of the first and second chip pads 240 and 340 may be electrically connected to a corresponding one of the upper pads 610 of the interposer substrate 600. Each chip pad of the first and second chip pads 240 and 340 may include or be formed of a conductive metallic material, for example, at least one metal selected from copper (Cu), aluminum (Al), tungsten (W), and titanium (Ti).

Neighboring two second semiconductor chips 300 may have upper bumps 350 interposed therebetween. The upper bumps 350 may be electrically connected to the chip vias 360 of a corresponding one of the second semiconductor chips 300. The upper bumps 350 may electrically connect the second semiconductor chips 300 to each other.

An under-fill layer 450 may be interposed between neighboring two of the second semiconductor chips 300. The under-fill layer 450 may fill a space between the upper bumps 350 and may encapsulate the upper bumps 350. For example, the under-fill layer 450 may include a non-conductive film (NCF), such as an Ajinomoto build-up film (ABF).

A plurality of chip bumps 250 may be interposed between the interposer substrate 600 and the first semiconductor chip 200 and between the interposer substrate 600 and the lowermost second semiconductor chip 300. The chip bumps 250 may electrically connect the interposer substrate 600 to the first semiconductor chip 200, and also electrically connect the interposer substrate 600 to the lowermost second semiconductor chip 300. The first chip pads 240 of the first semiconductor chip 200 and the second chip pads 340 of the lowermost second semiconductor chip 300 may be electrically connected through corresponding chip bumps 250 to corresponding upper pads 610. Each of the chip bumps 250 may include a conductive material and may have at least one selected from a solder ball shape, a bump shape, and a pillar shape. A pitch of the chip bumps 250 may be less than that of the substrate bumps 650.

A first chip under-fill layer 420 may be interposed between the interposer substrate 600 and the first semiconductor chip 200. A second chip under-fill layer 430 may be interposed between the interposer substrate 600 and the second semiconductor chip 300. The first chip under-fill layer 420 and the second chip under-fill layer 430 may fill a space between the chip bumps 250 and may encapsulate the chip bumps 250. For example, each of the first chip under-fill layer 420 and the second chip under-fill layer 430 may include a non-conductive film (NCF), such as an Ajinomoto build-up film (ABF).

A molding layer 400 may be provided on the interposer substrate 600. The molding layer 400 may cover a top surface of the interposer substrate 600, a sidewall of the first semiconductor chip 200, and sidewalls of the second semiconductor chips 300. In some embodiments, the molding layer 400 may expose a top surface of the first semiconductor chip 200 and a top surface of the uppermost second semiconductor chip 300. The molding layer 400 may include a dielectric polymer, such as an epoxy molding compound (EMC).

A semiconductor device according to the present inventive concepts may be configured such that a substrate is provided thereon with a first passivation pattern and a second passivation pattern, and that the first passivation pattern covers an upper sidewall of a via structure. Therefore, even when the via structure undergoes a polishing process as a subsequent process, the via structure may have a flat top surface. As a result, an increased contact area may be provided between the via structure and a pad structure, and thus the semiconductor device may increase in reliability.

In a semiconductor device fabricating method according to the present inventive concepts, first to third passivation layers may be formed on a via structure, and thereafter a polishing process may be performed on a substrate. Therefore, even when the polishing process is performed, the via structure may be prevented from being curved or bent. As a result, the via structure may be effectively connected to a pad structure which will be formed in a subsequent process, a semiconductor device may increase in reliability.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive. Accordingly, all such modifications are intended to be included within the scope of the present disclosure as defined in the appended claims.

What is claimed is:

1. A semiconductor device, comprising:
a substrate including a first surface and a second surface that are opposite to each other;
a first passivation pattern in contact with the first surface of the substrate, the first passivation pattern including a recess region that is recessed toward the first surface of the substrate;
a via structure that penetrates the substrate and the first passivation pattern;
a second passivation pattern disposed above the first passivation pattern, filled the recess region of the first passivation pattern, and spaced apart from the via structure; and
a pad structure on the second passivation pattern,
wherein a bottom surface of the pad structure is at a level higher than a level of a bottom surface of the recess region,
wherein the via structure is disposed in a via hole, contacts the first passivation pattern, and includes:
a through via that penetrates the substrate, and includes a conductive material; and
a via dielectric layer between the substrate and the through via and between the first passivation pattern and the through via covering an inner sidewall of the via hole,
wherein the substrate includes a semiconductor material, wherein each of the first passivation pattern and the second passivation pattern includes a dielectric material, and wherein the pad structure contacts the uppermost surface of the first passivation pattern and a portion of the second passivation pattern, and includes a conductive material.

2. The semiconductor device of claim 1, wherein the bottom surface of the pad structure is flat.

3. The semiconductor device of claim 1, wherein the dielectric material of the first passivation pattern and the dielectric material of the second passivation pattern are different materials from each other.

4. The semiconductor device of claim 1, wherein, when viewed in plan, the first passivation pattern exposed on a top surface of the via structure has a circular ring shape.

5. The semiconductor device of claim 1, wherein the second passivation pattern is spaced apart from the via dielectric layer.

6. The semiconductor device of claim 5, wherein a top surface of the via structure is coplanar with the uppermost surface of the first passivation pattern.

7. The semiconductor device of claim 1, wherein an uppermost surface of the first passivation pattern is exposed by the second passivation pattern and the via structure.

8. The semiconductor device of claim 1, wherein a thickness of the first passivation pattern is greater than a thickness of the second passivation pattern.

9. The semiconductor device of claim 1, wherein a thickness of the first passivation pattern is in a range of about 1 μm to about 3 μm.

10. The semiconductor device of claim 1, wherein a thickness of the second passivation pattern is in a range of about 0.1 μm to about 0.6 μm.

11. A semiconductor device, comprising:
a substrate including a first surface and a second surface that are opposite to each other;
a via structure that penetrates the substrate;
a first passivation pattern on the first surface of the substrate, the first passivation pattern extending onto an upper sidewall of the via structure;
a second passivation pattern disposed above the first passivation pattern, the second passivation pattern exposing an uppermost surface of the first passivation pattern; and
a pad structure on the via structure,
wherein at least a portion of the second passivation pattern is externally exposed,
wherein the first passivation pattern includes at least one selected from oxide and silicon oxide,
wherein the via structure includes:
a through via that penetrates the substrate, and includes a conductive material; and
a via dielectric layer interposed between the substrate and the through via and interposed between the first passivation pattern and the through via,
wherein the second passivation pattern includes at least one selected from nitride and silicon nitride,
wherein the substrate includes a semiconductor material, and
wherein a top surface of the second passivation pattern and the uppermost surface of the first passivation pattern contact the pad structure.

12. The semiconductor device of claim 11, wherein the first passivation pattern is in contact with the first surface of the substrate.

13. The semiconductor device of claim 11, wherein a top surface of the second passivation pattern is at a level the same as a level of a top surface of the via structure.

14. The semiconductor device of claim 11, wherein a top surface of the second passivation pattern is coplanar with the uppermost surface of the first passivation pattern.

15. The semiconductor device of claim 11, further comprising:
a dielectric layer on the second surface of the substrate; and
a conductive pattern disposed in the dielectric layer and electrically connected to the via structure.

16. The semiconductor device of claim 11, wherein the pad structure is disposed on the via structure, the first passivation pattern, and the second passivation pattern, and includes a conductive material.

17. The semiconductor device of claim 16, wherein a bottom surface of an end of the pad structure is in contact with the top surface of the second passivation pattern.

18. The semiconductor device of claim 16, wherein the pad structure is in contact with the first passivation pattern that extends onto the upper sidewall of the via structure.

19. A semiconductor device, comprising:
a substrate including a first surface and a second surface that are opposite to each other;
a first passivation pattern in contact with the first surface of the substrate, the first passivation pattern including a recess region that is recessed toward the first surface of the substrate;
a second passivation pattern that fills the recess region;
a via structure that penetrates the substrate and the first passivation pattern;
a pad structure on the first surface of the substrate, a bottom surface of an end of the pad structure being in contact with a top surface of the second passivation pattern;
a dielectric layer on the second surface of the substrate;
a conductive pattern in the dielectric layer; and
a connection terminal disposed on a bottom surface of the dielectric layer and electrically connected to the conductive pattern,
wherein the first passivation pattern extends onto an upper sidewall of the via structure and contacts the pad structure,
wherein the via structure is disposed in a via hole, contacts the first passivation pattern, and includes:
a through via that penetrates the substrate, and includes a conductive material; and
a via dielectric layer between the substrate and the through via and between the first passivation pattern and the through via conformally covering an inner sidewall of the via hole,
wherein the substrate includes a semiconductor material,
wherein each of the first passivation pattern and the second passivation pattern includes a dielectric material, and
wherein the pad structure contacts the uppermost surface of the first passivation pattern and a portion of the second passivation pattern, and includes a conductive material.

20. The semiconductor device of claim 19, wherein the first passivation pattern and the second passivation pattern expose a top surface of the via structure.

* * * * *